_(12)_ United States Patent
Han

(10) Patent No.: US 6,580,651 B2
(45) Date of Patent: Jun. 17, 2003

(54) REDUCED POWER BIT LINE SELECTION IN MEMORY CIRCUITS

(75) Inventor: Jong Hee Han, Seoul (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/056,428

(22) Filed: Jan. 23, 2002

(65) Prior Publication Data

US 2002/0067643 A1 Jun. 6, 2002

Related U.S. Application Data

(62) Division of application No. 09/474,872, filed on Dec. 29, 1999, now Pat. No. 6,392,911.

(30) Foreign Application Priority Data

Dec. 30, 1998 (KR) .......................................... 1998-61064

(51) Int. Cl.[7] .............................................. G11C 7/00
(52) U.S. Cl. ...................................... 365/191; 365/207
(58) Field of Search .................................. 365/191, 207, 365/205, 202, 222, 196

(56) References Cited

U.S. PATENT DOCUMENTS

| | | | | |
|---|---|---|---|---|
| 4,916,667 A | * | 4/1990 | Miyabayashi et al. | 365/189.04 |
| 5,404,338 A | | 4/1995 | Murai et al. | 365/233 |
| 5,517,462 A | | 5/1996 | Iwamoto et al. | 365/233 |
| 5,602,771 A | | 2/1997 | Kajigaya et al. | 365/51 |
| 5,629,898 A | | 5/1997 | Idei et al. | 365/222 |
| 5,774,408 A | * | 6/1998 | Shirley | 365/207 |
| 5,894,445 A | * | 4/1999 | Kobayashi | 365/201 |
| 6,005,801 A | | 12/1999 | Wu et al. | 365/175 |
| 6,091,625 A | | 7/2000 | Braun et al. | 365/145 |
| 6,104,652 A | | 8/2000 | Raad et al. | 365/203 |
| 6,154,406 A | | 11/2000 | Miyano et al. | 365/210 |
| RE36,993 E | | 12/2000 | Takashima et al. | 365/51 |
| 6,233,181 B1 | | 5/2001 | Hidaka | 365/200 |

* cited by examiner

Primary Examiner—Richard Elms
Assistant Examiner—Anh Phung
(74) Attorney, Agent, or Firm—Horace H. Ng; Townsend and Townsend and Crew, LLP

(57) ABSTRACT

A method for reducing power consumption during bit line selection in memory circuits is disclosed. According to an exemplary aspect of the method, two adjacent memory cell arrays in memory circuits generally share a row of bit-line sense amplifiers. These sense amplifiers are usually connected to a memory cell array via a number of switches. These switches specifically connect the bit lines of each of two adjacent memory cell arrays to the row of sense amplifiers. By controlling the switches, the row of sense amplifiers can be directed to serve either one of the two adjacent memory cell arrays. The switches may be connected to a bit line select control line. To achieve the desired reduction of power consumption, the present invention controls the bit-line select control line in such a way that the bit-line select control line connected to a currently active memory cell array is switched only when the next memory operation involves an adjacent memory cell array sharing the same row of bit-line sense amplifiers controlled by such bit line select control line.

12 Claims, 15 Drawing Sheets

(PRIOR BRT)

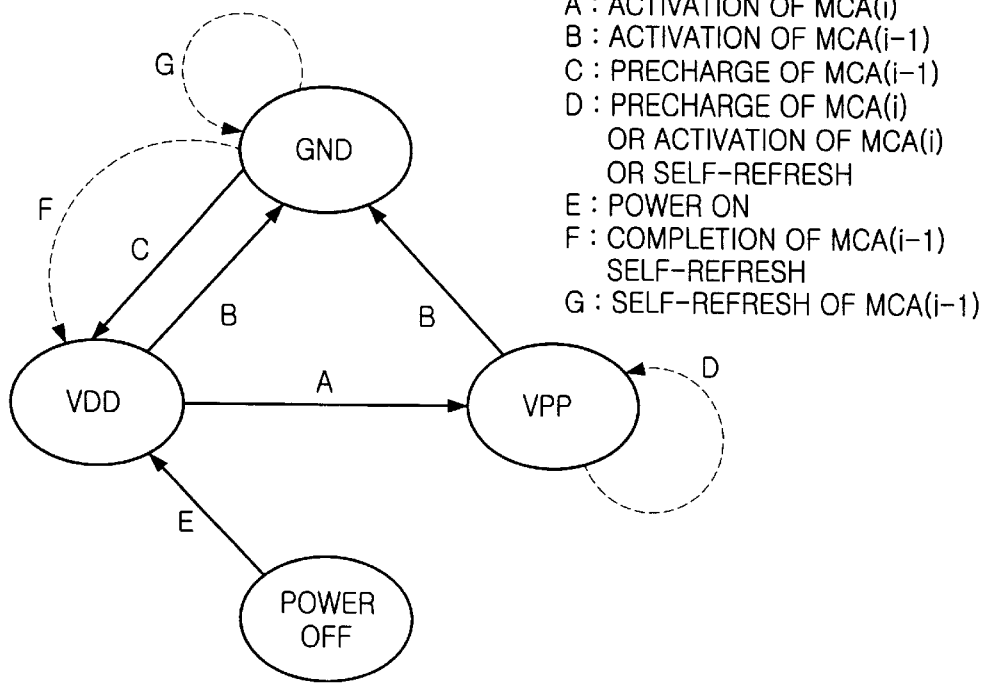

FIG. 5A  TRANSITION OF bls_up(i)
A : ACTIVATION OF MCA(i)
B : ACTIVATION OF MCA(i-1)
C : PRECHARGE OF MCA(i-1)
D : PRECHARGE OF MCA(i)
    OR ACTIVATION OF MCA(i)
    OR SELF-REFRESH
E : POWER ON
F : COMPLETION OF MCA(i-1)
    SELF-REFRESH
G : SELF-REFRESH OF MCA(i-1)

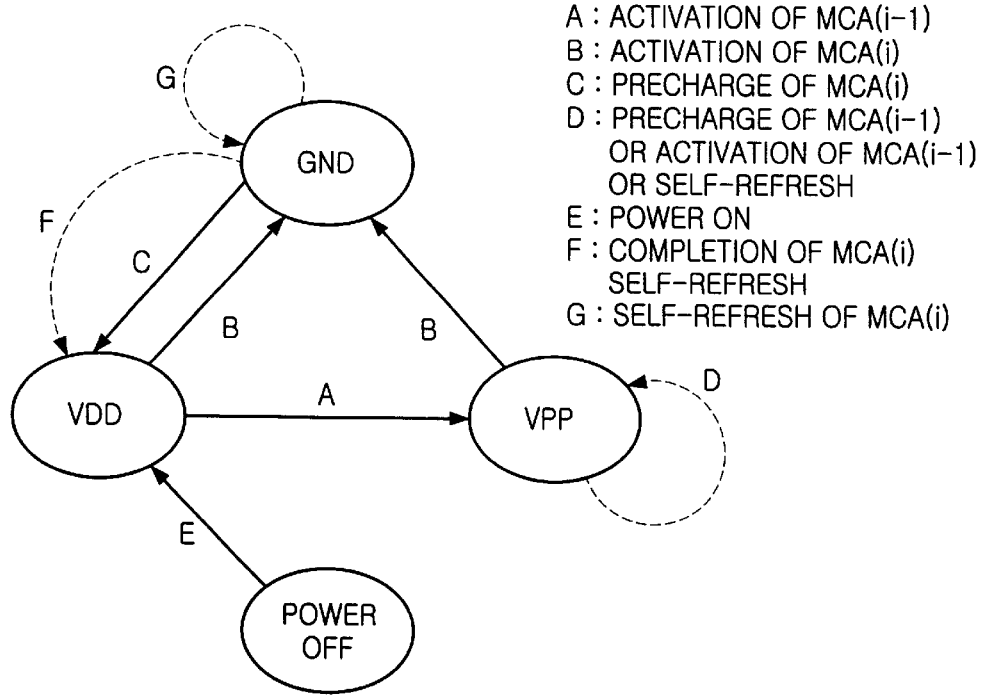

FIG. 5B  TRANSITION OF bls_down(i-1)
A : ACTIVATION OF MCA(i-1)
B : ACTIVATION OF MCA(i)
C : PRECHARGE OF MCA(i)
D : PRECHARGE OF MCA(i-1)
    OR ACTIVATION OF MCA(i-1)
    OR SELF-REFRESH
E : POWER ON
F : COMPLETION OF MCA(i)
    SELF-REFRESH
G : SELF-REFRESH OF MCA(i)

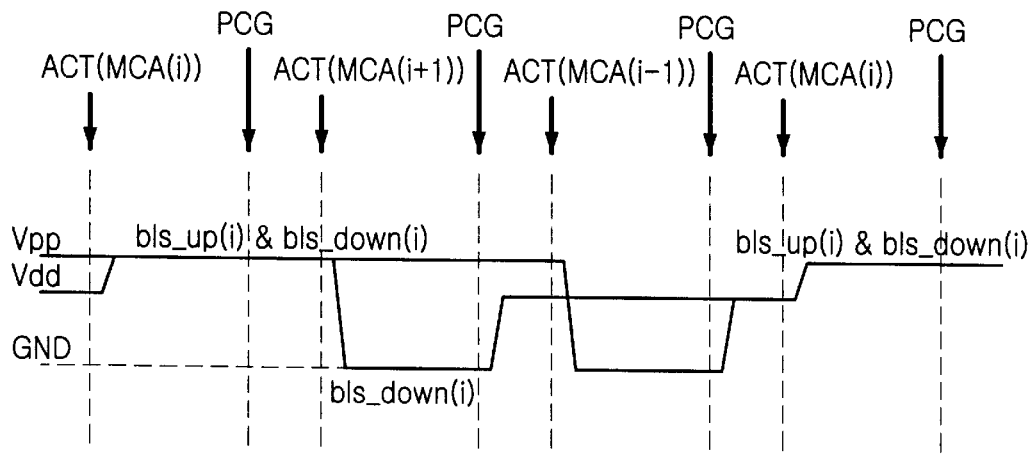
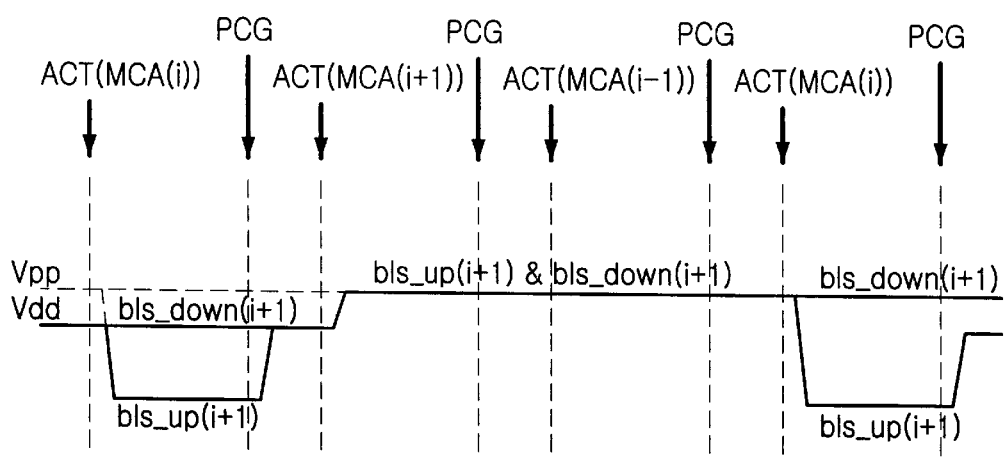
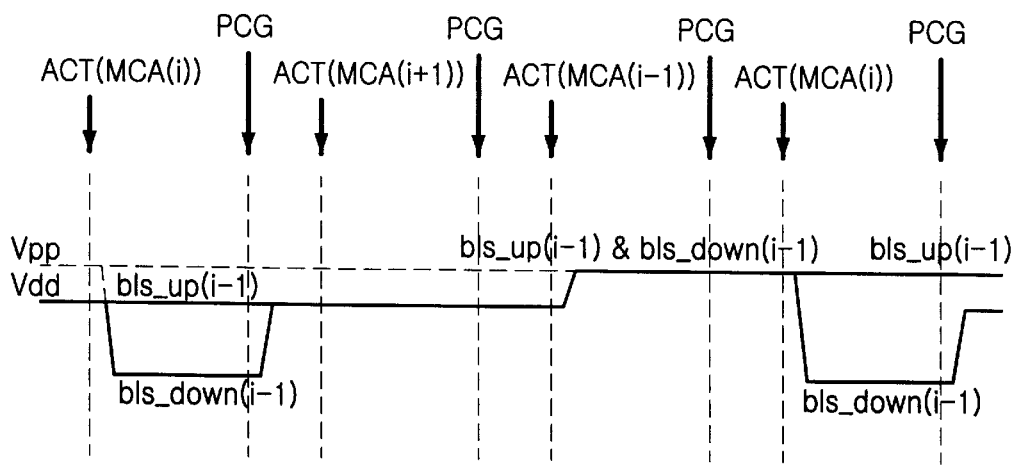

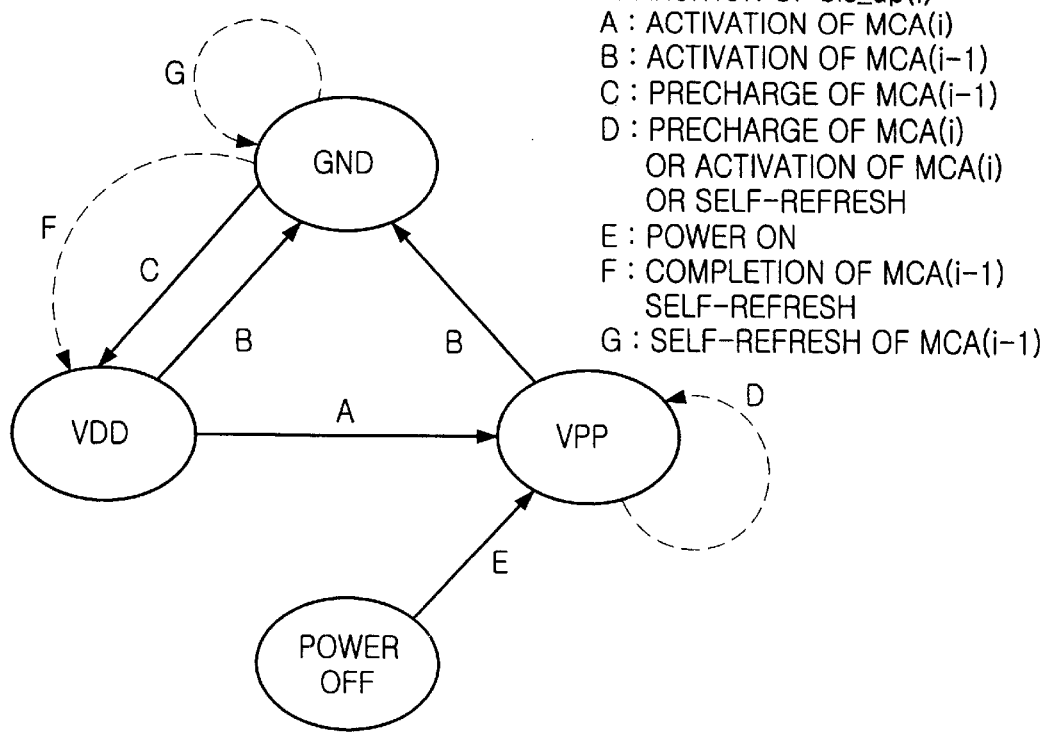

FIG. 9A  TRANSITION OF bls_up(i)
A : ACTIVATION OF MCA(i)
B : ACTIVATION OF MCA(i-1)
C : PRECHARGE OF MCA(i-1)
D : PRECHARGE OF MCA(i)
    OR ACTIVATION OF MCA(i)
    OR SELF-REFRESH
E : POWER ON
F : COMPLETION OF MCA(i-1)
    SELF-REFRESH
G : SELF-REFRESH OF MCA(i-1)

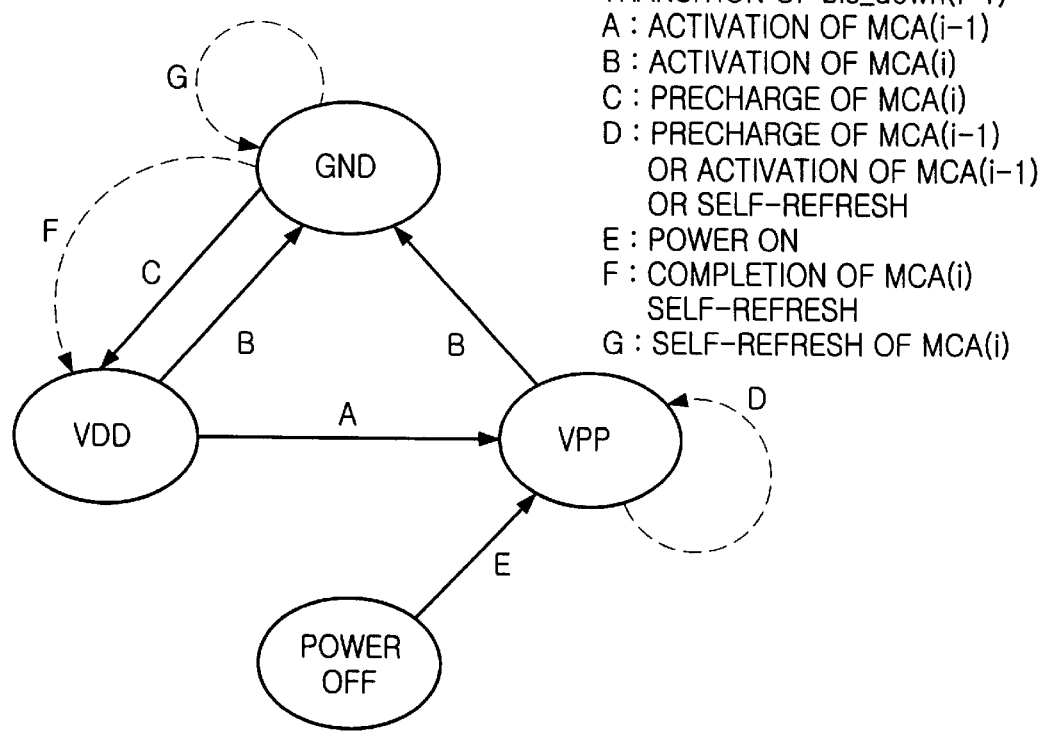

FIG. 9B  TRANSITION OF bls_down(i-1)
A : ACTIVATION OF MCA(i-1)
B : ACTIVATION OF MCA(i)
C : PRECHARGE OF MCA(i)
D : PRECHARGE OF MCA(i-1)
    OR ACTIVATION OF MCA(i-1)
    OR SELF-REFRESH
E : POWER ON
F : COMPLETION OF MCA(i)
    SELF-REFRESH
G : SELF-REFRESH OF MCA(i)

REDUCED POWER BIT LINE SELECTION IN MEMORY CIRCUITS

CROSS REFERENCES TO RELATED APPLICATION

The present application is a divisional application which claims the benefit of priority under 35 U.S.C. §120 from U.S. patent application Ser. No. 09/474,872 filed on Dec. 29, 1999, now U.S. Pat. No. 6,392,911, issued on May 21, 2002, which, in turn, claims the benefit of priority under 35 U.S.C. §119 from a Korean patent application, Ser. No. 98-61064, filed on Dec. 30, 1998."

BACKGROUND OF THE INVENTION

This invention relates in general to memory integrated circuits. In particular, this invention relates to a method and apparatus for reducing power consumption during bit line selection in memory circuits.

Memory circuits such as dynamic random access memories (DRAMs) are generally made up of a large number of memory cells arranged in the form of a matrix or array with rows and columns. FIG. 1 is a simplified block diagram of a conventional DRAM. In this typical example, memory access to the DRAM usually takes place as follows. The address buffer first reads the row address and then the column address. The addresses are passed to their respective decoders for decoding. Once decoded, the memory cell addressed outputs the stored data, which is amplified by a sense amplifier and transferred to a data output buffer by an I/O gate.

The central part of the DRAM is the memory cell array 100, which is where the data are stored. FIG. 2 is a simplified block diagram of a conventional DRAM showing an illustrative structure of the memory cell array 100. The memory cell array 100 is made up of many unit memory cells, each of which is usually individually addressable and used to store a bit. Unit memory cells are defined by word lines WLx (or rows) and bit lines BLx (or columns). The unit memory cell has a capacitor which holds the data in the form of electrical charges, and an access transistor which serves as a switch for selecting the capacitor. The transistor's gate is connected to the word line WLx. The source of the access transistors are alternately connected to the bit lines BLx. At this level, memory access begins when a word line is selected (via the decoding of a row address) thereby switching on all the access transistors connected to that word line. In other words, all the unit memory cells in that particular row are turned on. As a result, charges in the capacitor within each unit memory cell are transferred onto the bit lines causing a potential difference between the bit lines. This potential difference is detected and amplified by a sense amplifier. This amplified potential difference is then transferred to the I/O gate activated based on the column address, which in turn transfers the amplified signal to the data output buffer.

The precharge circuit plays a significant role in detecting memory data during the course of a memory access operation. In advance of a memory access and the activation of a word line, the precharge circuit charges all bit line pairs up to a certain potential which usually equals to half of the supply potential, that is, Vdd/2. The bit line pairs are short-circuited by a transistor so that they are each at an equal potential. The precharging and potential equalization by the precharging circuit is important due to the disparate difference in capacitance between the bit lines and the storage capacitor. Since the capacitance of the storage capacitor is far less than that of the bit lines, when the storage capacitor is connected to the bit lines via the access transistor, the potential of the bit line changes only slightly, typically by 100 mV. If the storage capacitor was empty, then the potential of the bit line slightly decreases; if charged, then the potential increases. The activated sense amplifier amplifies the potential difference on the two bit lines of the pair. In the first case, it draws the potential of the bit line connected to the storage capacitor down to ground and raises the potential of the other bit line up to Vdd. In the second case, the bit line connected to the storage capacitor is raised to Vdd and the other bit line decreased to ground.

Without the precharging circuit, the sense amplifier would need to amplify the absolute potential of the bit lines. However, because of the relatively small potential change between the bit lines, the amplifying process would be much less stable and unreliable.

It should be noted that as the access transistors remain on by the activated word line, the accessed data are written back into the memory cells of one row. Therefore, the accessing of a single memory cell simultaneously leads to a refreshing of the whole word line. After the data output is completed, the sense amplifiers and the row and column decoders are disabled and the I/O gate block is switched off. At that time, the bit lines are still on the potentials according to the accessed data. The refreshed memory cells along the same row are disconnected from the bit lines by the disabled word line. The precharge circuit is activated to lower and increase respectively the potentials of the bit lines to Vdd/2 and equalize them again. The memory array is then ready for another memory access.

In addition, as previously mentioned, the data are stored in the form of electrical charges in the storage capacitor. Ideally, the charges in the storage capacitor should remain indefinitely. However, as a practical matter, the storage capacitor discharges over the course of time via the access transistor and its dielectric layer thereby losing the stored charges and the represented data. Hence the storage capacitor must be refreshed periodically. As discussed above, during the course of a memory access, a refresh of the memory cells within the addressed row is automatically performed. As is commonly known in the art, three refresh methods are typically used, namely, the RAS-only refresh, the CAS-before-RAS refresh, and the hidden refresh.

Due to physical constraints, the size of a memory array 100 is limited. Thus, in order to increase memory capacity, memory arrays 100 are typically stacked together to provide for the desired capacity. FIG. 3 is a simplified block diagram showing a typical structure having stacked memory arrays 100. The sense amplifiers 102 are shared by adjacent pairs of memory arrays 100 but otherwise perform the same function as mentioned above. The precharge circuit (not shown) which performs the precharge and equalization functions as mentioned above may be incorporated into a sense amplifier.

Referring to FIG. 3, a number of stacked memory cell arrays 100 ("MCAs") are used to provide data storage. As is commonly known in the art, the number of MCAs to be used depends on the desired memory capacity and other system constraints. In FIG. 3, three representative MCAs 100*a*, 100*b*, 100*c* are shown. Each MCA 100 has pairs of bit lines, for example, bit line pair b1(0) and b1($\overline{0}$), accessible on its either side.

Positioned between an adjacent pair of MCAs, such as MCAs 100*a*, 100*b* and MCAs 100*b*, 100*c*, are a row of bit-line sense amplifiers 102 (each a "BLSA"). The number of BLSAs 102 corresponds to the number of bit line pairs of each MCA 100. Each BLSA 102 is electrically connected to both members of the adjacent pair of MCAs such as MCAs 100a, 100b. More specifically, each BLSA 102 is coupled to a bit line pair, for example, b1(0) and b1(0) of a MCA 100 via two switches, such as transistors 104. Hence, each BLSA 102 is connected to four transistors 104, in total, two transistors for each MCA 100.

A bit-line select controller 106 ("BLSC") is used to control the operation of each row 108 of BLSAs 102. Each BLSC 106 has two control lines 110a, 110b extending therefrom. One control line 110a is connected in parallel to the gate of all the transistors 104 connecting the row 108u of BLSAs 102 to one member MCA 100a of the adjacent pair, while the other control line 110b is similarly connected to all the transistors 104 connecting the row 108u of BLSAs 102 to the other member MCA 100b of the adjacent pair.

FIGS. 4a–c are various voltage level diagrams. Specifically, FIG. 4a shows the voltage level of successively activated word lines within one MCA(i) 100b. For each active cycle, the potential of each word line, for example, WL(n), first goes from ground to Vpp and then back down to ground before the next active cycle begins. The voltage Vpp is a boosted voltage, that is greater than the internal power supply voltage Vdd used for the memory cell operation, needed to overcome the transistor threshold voltage Vt drop.

FIG. 4b shows the respective voltage levels of various BLS control lines 110a, 110b including BLS_up(i), BLS_down(i), BLS_up(i+1) and BLS_down(i-1) during active cycles when MCA(i) 100b is activated. In this embodiment, all the BLS control lines 110a, 110b are initially at Vdd. For each active cycle, the potential of BLS_up(i) 100b and BLS_down(i) 110a for the selected array MCA(i) 100b first goes from Vdd to Vpp and then back down to Vdd before the next active cycle begins; while the potential of BLS_up(i+1) 100b and BLS_down(i-1) 110a for the non-selected adjacent arrays MCA(i+1) 100c and MCA(i-1) 10a first drops from Vdd to ground and then back up to Vdd before the next active cycle begins. In this way, the two rows of shared bit-line sense amplifiers 108u and 108d are connected to array MCA(i) 100b and disconnected from adjacent arrays MCA(i+1) 100c and MCA(i-1) 100a during each active cycle.

FIG. 4c similarly shows the respective voltage levels of the same BLS control lines 110a, 110b using different relative voltage levels. In this embodiment, all the BLS control lines 110a, 110b are initially at Vpp. For each active cycle, the potential of BLS_up(i) 110b and BLS_down(i) 110a remains the same; while the potential of BLS$_{13}$ up(i+1) 110b and BLS_down(i-1) 110a first drops from Vpp to ground and then back up to Vpp before the next active cycle begins.

As FIGS. 4b and 4c show, during the activation of word lines within one activated MCA(i) 100b, at least two, if not more, of the involved BLS control lines BLS_up(i) 110b, BLS_down(i) 110c, BLS_up(i+1) 110d and BLS_down(i-1) 110a have to be switched back and forth between the designated high and low voltage levels during each active cycle. Such constant switching of the BLS control lines 110a–d during each active cycle consumes power. This type of power consumption is a particular cause for concern in modern integrated circuits. Since modern integrated circuits generally contain a high number of memory cell arrays and bit-line select controllers, the cumulative power consumption due to the constant switching of BLS control lines may reach an undesirably excessive level. Therefore, there is a need to minimize the amount of BLS control lines switching thereby reducing power consumption in memory circuits.

SUMMARY OF THE INVENTION

In accordance with the present invention, the state of a bit-line select control line connected to a currently active memory cell array is changed only when the next memory operation involves an adjacent memory cell array sharing the same row of bit-line sense amplifiers connected to such bit line select control line. Otherwise, the state of the bit-line select control line is not switched even when the array to which it connects is no longer active.

An exemplary embodiment of the present invention includes a memory circuit having a number of memory cell arrays and a number of rows of bit-line sense amplifiers. Each row of the bit-line sense amplifiers is disposed between and coupled to a pair of adjacent memory cell arrays. The exemplary embodiment further includes a number of bit-line select controllers. Each bit-line select controller includes a bit-line select control line extending therefrom and coupling to one of the rows of bit-line sense amplifiers for controlling the operation thereof Each bit-line select control line is used to control the coupling between a row of bit-line sense amplifiers and one member of a pair of adjacent memory cell arrays. Once switched on, the bit-line select control line is switched off only when the other member of the pair of adjacent memory cell arrays is to be activated.

Another exemplary embodiment of the present invention further includes a method of operating a memory circuit. The method includes the steps of disposing a number of bit-line sense amplifiers between a pair of adjacent arrays of memory cells; activating one member of the pair of adjacent arrays of memory cells; coupling the bit-line sense amplifiers to one member of the pair of adjacent arrays of memory cells by turning on a number of coupling switches; and keeping the coupling switches on until the other member of the pair of adjacent arrays of memory cells is activated.

Reference to the remaining portions of the specification, including the drawings and claims, will realize other features and advantages of the present invention. Further features and advantages of the present invention, as well as the structure and operation of various embodiments of the present invention, are described in detail below with respect to accompanying drawings. In the drawings, like reference numbers indicate identical or functionally similar elements and letters at the end of reference numbers are used for ease of reference to further differentiate each of a number of identical or functionally similar elements.

BRIEF DESCRIPTION OF THE DRAWINGS

FIG. 5a is a state transition diagram showing the state of transition of a BLS control line BLS_up(i) in a first preferred embodiment in accordance with the present invention;

FIG. 5b is a state transition diagram showing the state of transition of a BLS control line BLS_down(i−1) in a first preferred embodiment in accordance with the present invention;

FIGS. 8a, 8b, and 8c show the voltage levels of various BLS control lines during normal mode in accordance with the present invention;

FIGS. 9a and 9b show two state diagrams illustrating the state of transition of two BLS control lines in a second embodiment in accordance with the present invention;

DESCRIPTION OF THE SPECIFIC EMBODIMENTS

Figure 1:
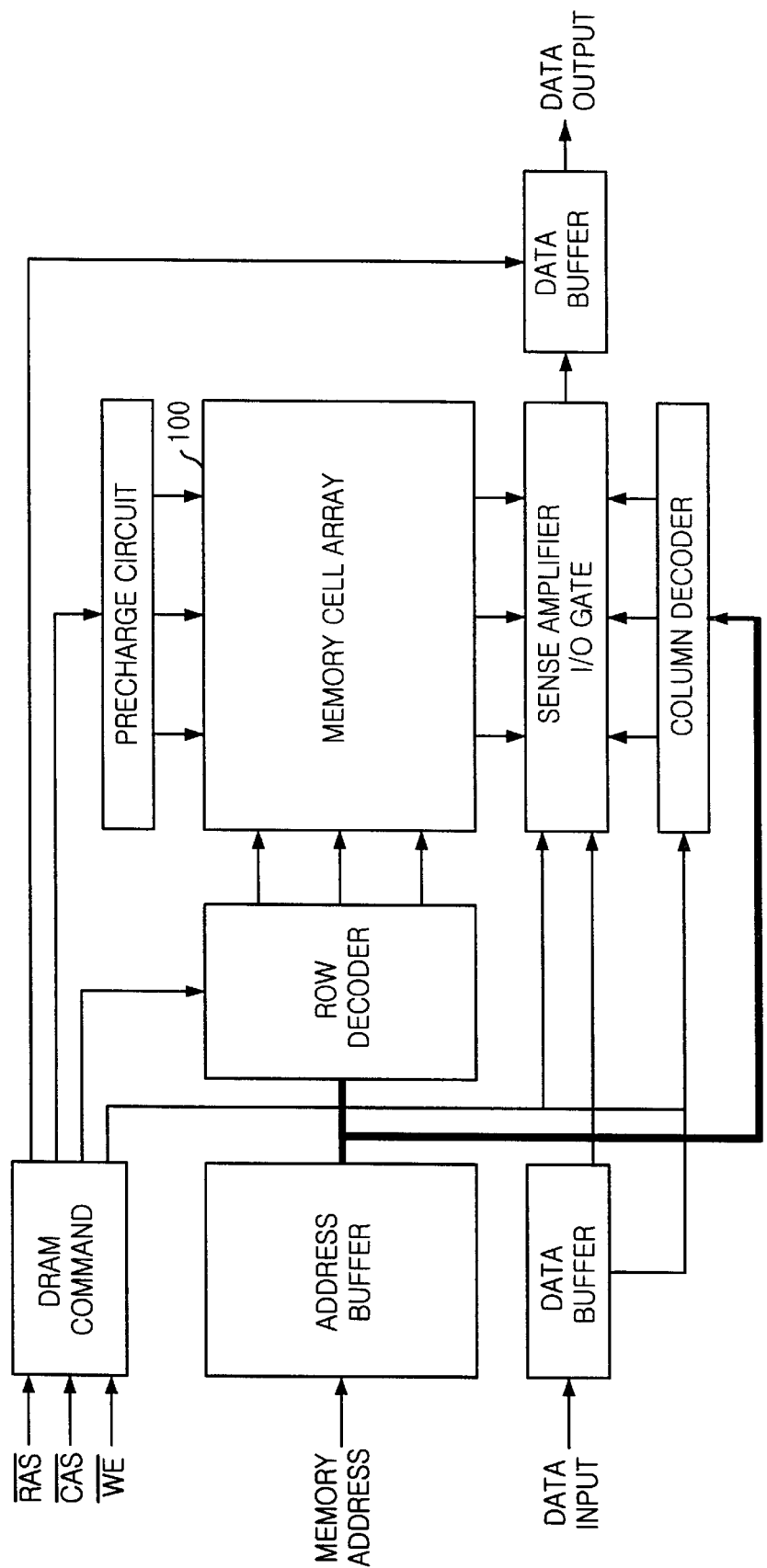
FIG. 1 is a simplified block diagram of a conventional DRAM.
Figure 2:
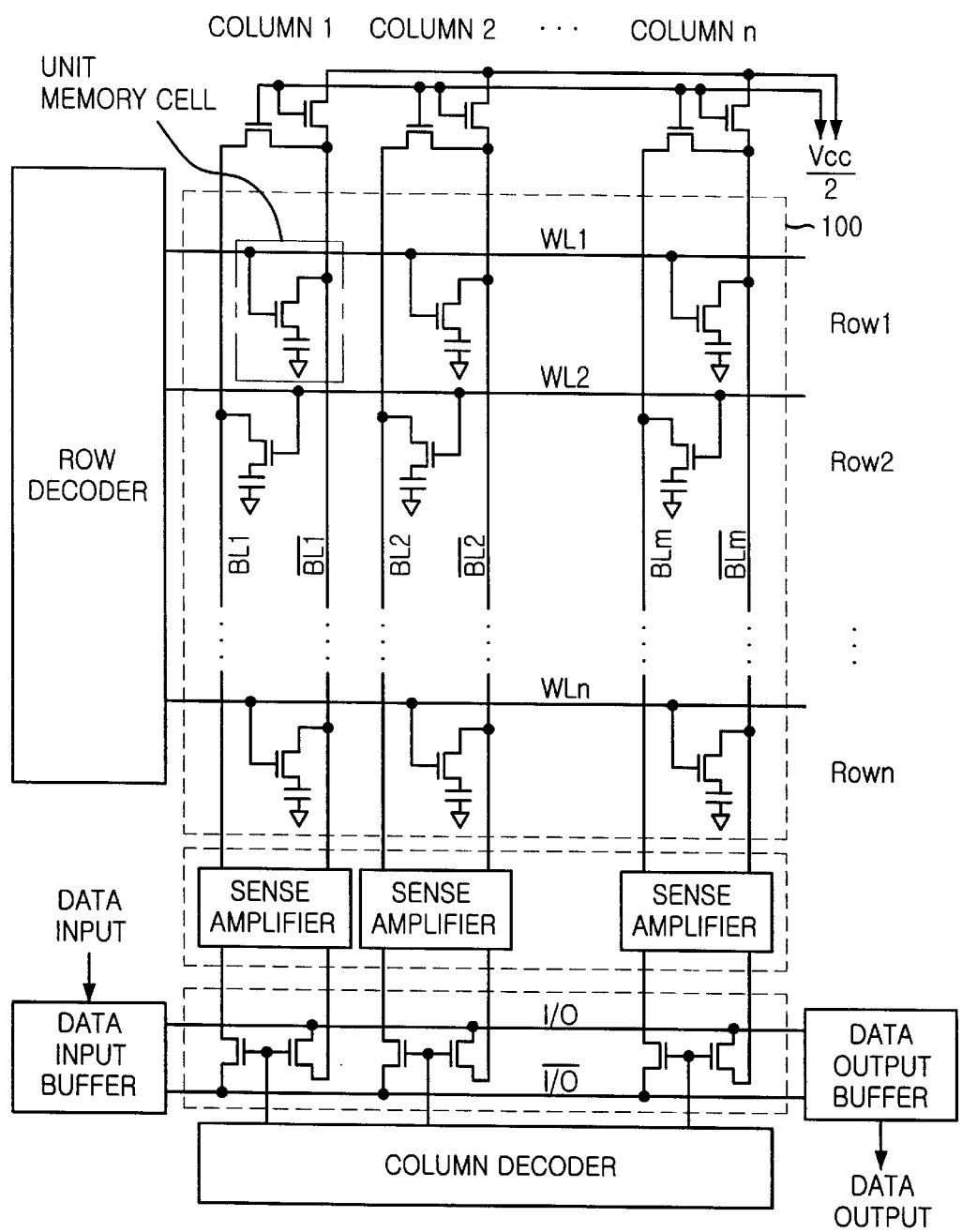
FIG. 2 is a simplified block diagram of a conventional DRAM showing an illustrative structure of the memory cell array.
Figure 3:
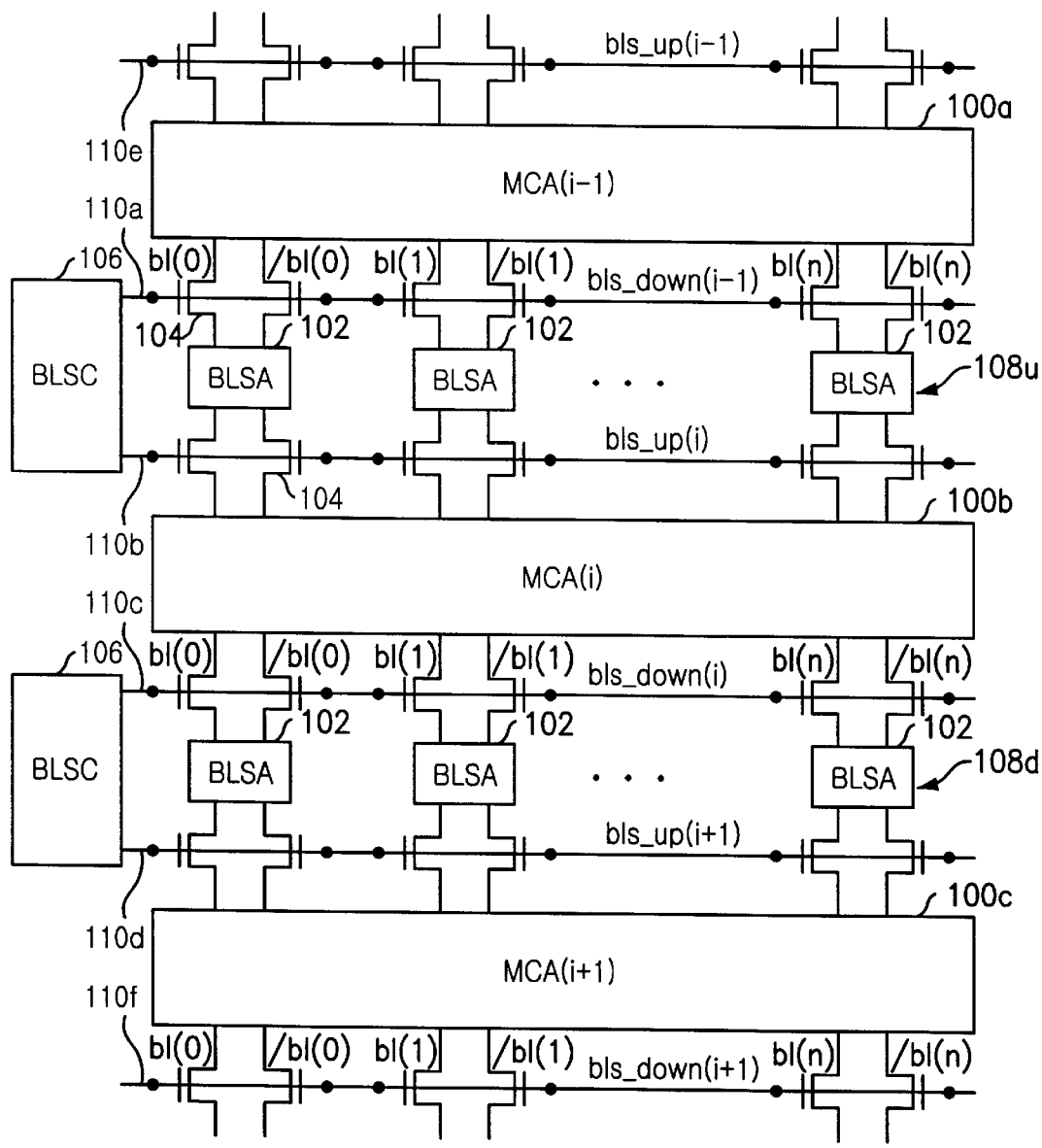
FIG. 3 is a simplified block diagram showing a typical structure having stacked memory arrays.

The present invention provides a new and improved method and apparatus to control and reduce switching of bit-line select control lines in memory circuit. The general operation of a preferred embodiment of the present invention will now be described. Referring to FIG. 3, when a specific MCA 100b is accessed, the two rows 108u and 108d of BLSAs 102 directly connected to that MCA(i) 100b are activated by the BLS controls 106 via the BLS control lines, BLS_up(i) 110b and BLS down(i) 110c, and are dedicated to serve exclusively that particular MCA(i) 100b. The BLS controls 106 continue to keep the BLSAs 102 activated in their respective current state pending the next memory operation. A BLS control line 100a controlling the BLSA 102 is directed to change its state only when an adjacent MCA sharing the same BLSAs 102 is to be accessed next. For example, if the adjacent MCA (i−1) 100a is required to be accessed next, BLS control 16 via control line, BLS_down(i−1) 110a, activates all the transistors 104 connecting the row 108u of BLSAs 102 to MCA (i−1) 100a and via control line, BLS_up(i) 110b, deactivates all the transistors 104 coupled between the row 108d of BLSAs 102 and MCA(i) 100b. The BLS control line, BLS_down(i) 110c, on the other hand, remains unchanged since MCA (i−1) does not share the same row 108d of BLSAs 102 as that controlled by BLS_down(i) 110c.

Referring to FIGS. 5a and 5b there are shown two state diagrams illustrating the state of transition of the BLS control lines in a first preferred embodiment according to the present invention. FIGS. 5a and 5b respectively show the state of transition of the two BLS control lines, BLS_up(i) 110b and BLS_down(i−1) 110a, controlled by BLS control 106 in accordance with the operation of MCA(i) 100b and MCA(i−1) 100a. It should be noted that as commonly understood in the art MCA(i) 100b and MCA(i−1) 100a cannot be activated simultaneously. It should be further noted that BLS_down(i) 110c and BLS_up(i+1) 110d are functionally equivalent to BLS_down(i−1) 110a and BLS_up(i) 110b respectively. Hence, it should be understood that FIG. 5a and FIG. 5b similarly apply to BLS_up(i+1) 110d and BLS_down(i) 110c respectively.

FIG. 5a shows the state of transition of the BLS control line BLS_up(i) 110b using MCA(i) 100b as a central point of reference. When the BLS control 106 is first turned on, BLS_up(i) 110b is initialized to Vdd. Once initialized, BLS control 106 waits to determine which MCA 100 is to be accessed next. If MCA(i) 100b is to be activated, then BLS_up(i) 110b is charged to Vpp. BLS_up(i) 110b is to remain at Vpp if the next operation requires MCA(i) 100b to be either precharged or activated or self-refreshed; but if the next operation requires MCA(i−1) 100a to be activated, then BLS_up(i) 110b is to be dropped to ground. BLS_up(i) 110b is to remain at ground if the next operation indicates that MCA(i−1) 100a is to engage in a self-refresh cycle; but if the next operation indicates that the self-refresh cycle of the MCA(i−1) 100a is completed or that the MCA(i−1) 100a is to be precharged, then BLS_up(i) 110b is to be raised to Vdd. Initially, while BLS_up(i) 110b is at Vdd, if the next operation shows that MCA(i−1) 100a is to be activated, then BLS_up(i) 110b is to be dropped to ground.

FIG. 5b similarly shows the corresponding state of transition of the BLS control line BLS_down(i−1) 110a in concert with the transition of BLS_up(i) 110b shown in FIG. 5a. The same explanation as given for FIG. 5a similarly applies. For example, as shown in FIG. 5a, when MCA(i) 100b is activated (represented by transition paths A or D), BLS_up(i) 100b is charged to Vpp; accordingly, as shown in FIG. 5b, when MCA(i) 100b is activated (represented by transition path B), BLS_down(i−1) 110a is dropped to ground.

It should be noted that while only BLS control 106 and its BLS control lines, BLS_up(i) 110b and BLS_down(i−1) 110a, are explained in detail, the same principles apply to other BLS controls and their respective BLS control lines, such as BLS control lines, BLS_up(i+1) 110d and BLS_down(i) 110c.

Figure 4A:
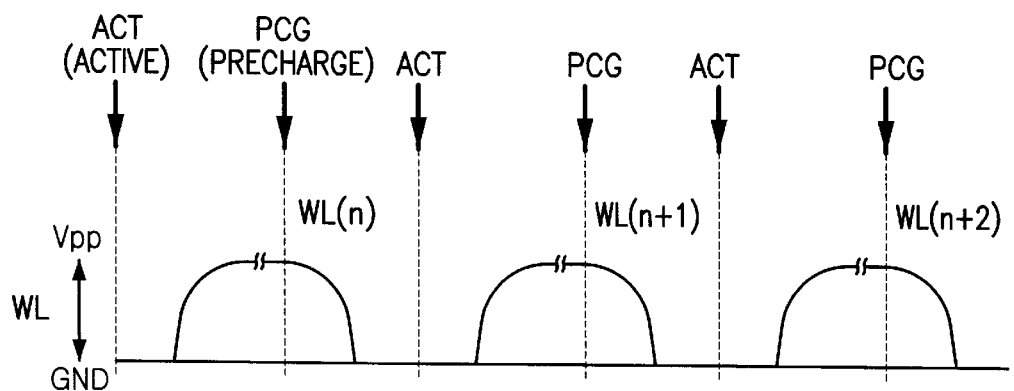
FIG. 4a is a diagram showing the voltage level of successively activated word lines within one MCA during active cycles.
Figure 4B:
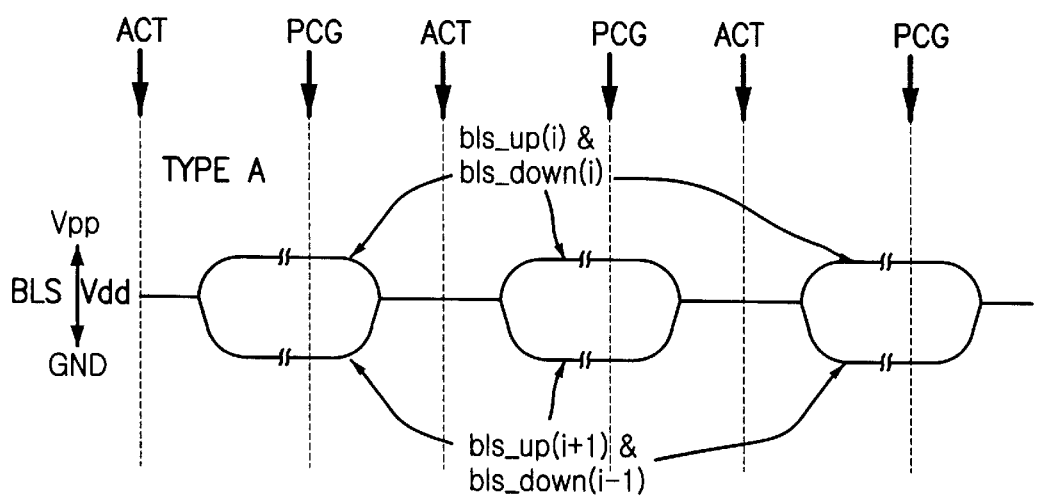
FIG. 4b is a diagram showing the respective voltage levels of various BLS control lines during active cycles when only one MCA is activated.
Figure 6A:
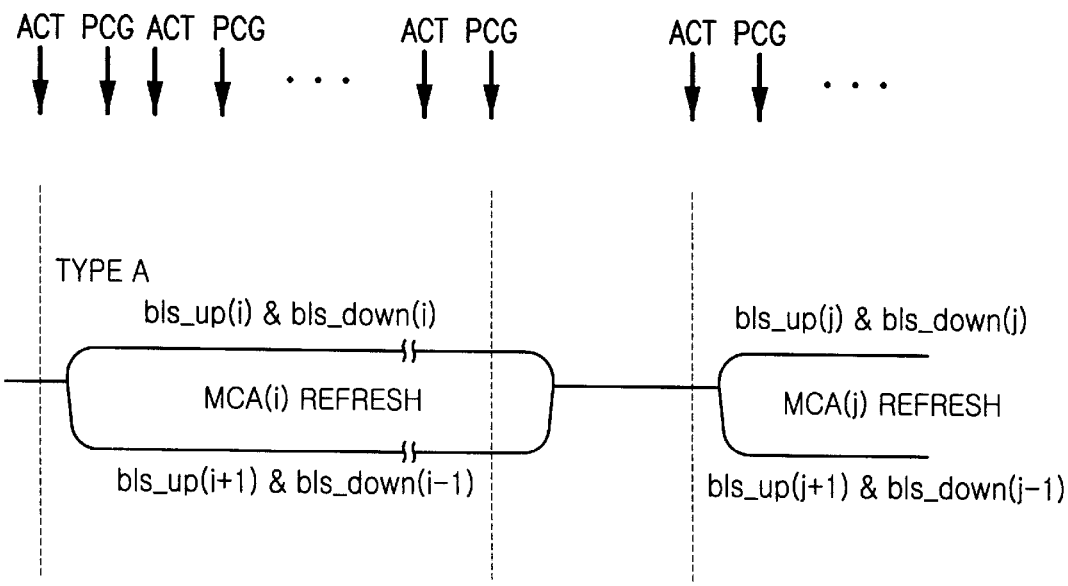
FIGS. 6a and 6b show the voltage levels of various BLS control lines during a self-refresh cycle of a MCA in accordance with the present invention.

FIG. 6a shows the voltage levels of various BLS control lines including, BLS_up(i) 110b, BLS_down(i) 110c, BLS_up(i+1) 110d, and BLS_down(i−1) 110a, during a self-refresh cycle of MCA(i) 100b in accordance with the present invention. As FIG. 6a shows, during the self-refresh cycle of MCA(i) 100b, once the BLS control lines reach their respective voltage levels, i.e., Vpp for BLS_up(i) 110b and BLS_down(i) 100c and ground for BLS_up(i+1) 110d, and BLS_down(i−1) 110a, they remain there until the self-refresh cycle is completed. During the self-refresh cycle, it is possible to keep BLS_up(i+1) 110d and BLS_ down(i−1) 110a at ground because the location of the next word line access is always within MCA(i) 100b. Hence, BLS_up(i+1) 110d and BLS_down(i−1) 110a do not need to be precharged since MCA(i−1) 100a and MCA(i+1) 100c will not be accessed when MCA(i) 100b is being self-refreshed. This is to be contrasted with FIG. 4b where those same BLS control lines have to be switched back and forth during each active cycle regardless of the fact that only MCA(i) 100b is activated.

Figure 7A:
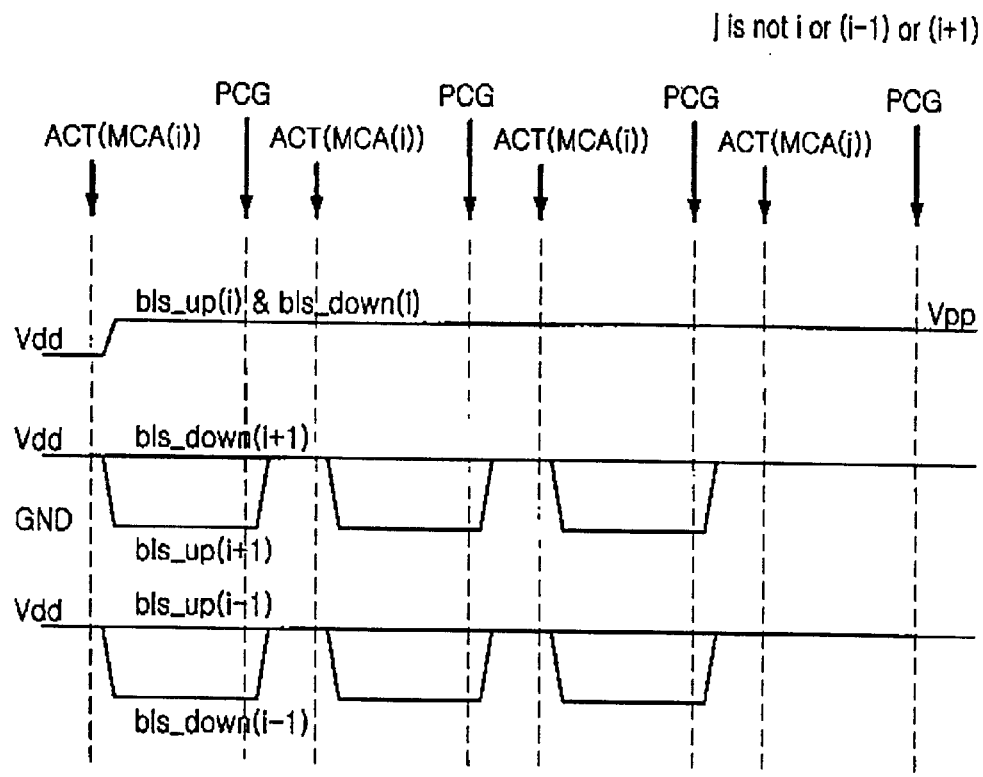
FIGS. 7a and 7b show the voltage levels of various BLS control lines during successive active cycles in the same MCA in accordance with the present invention.

FIG. 7a shows the voltage levels of various BLS controls lines including, BLS_up(i) 110b, BLS_down(i) 110c, BLS_down(i+1) 110f, BLS_up(i+1) 110d, BLS_up(i−1) 110e and BLS_down(i−1) 110a, during successive active cycles in the same MCA(i) 100b in accordance with the present invention. Following the state transition diagrams as shown in FIGS. 5a and 5b, during successive active cycles in the same MCA(i) 100b, the BLS control lines, BLS_up(i) 110b and BLS_down(i) 110c, are pulled up to Vpp only once and remain there, while BLS_down(i−1) 110a and BLS_up(i+1) 110d are pulled to ground at the beginning of each active cycle and raised to Vdd during each precharge.

It is worth noting that the behavior of BLS_up(i+1) 110d and BLS_down(i−1) 110a in FIG. 7a is different from that shown in FIG. 6a. In FIG. 7a, there is shown successive active cycles in the same MCA(i) 100b. It is to be understood that unlike a self-refresh cycle shown in FIG. 6a, these successive active cycles in FIG. 7a do not necessarily all have to take place in MCA(i) 100b, but that for illustrative purposes only, these successive active cycles all incidentally take place in MCA(i) 100b. Therefore, BLS_up(i+1) 110d and BLS_down(i−1) 110a have to be raised to Vdd to allow the bit lines in the unselected arrays MCA(i−1) 100a and MCA (i+1) 100c to be precharged at a specified voltage thereby providing for the possibility that the next memory operation may take place in either MCA(i−1) 100a or MCA(i+1) 100c. This is to be contrasted with FIG. 6a where BLS_up(i+1) 110d and BLS_down(i−1) 110a are only pulled up to Vdd at the end of the self-refresh cycle. That is because those bit lines do not need to be precharged since MCA(i−1) 100a and MCA(i+1) 100c will never be active when MCA(i) 100b is engaged in a self-refresh cycle. BLS_up(i+1) 110d and BLS_down(i−1) 110a only need to be precharged when there is a possibility that the next memory operation might involve either MCA(i−1) 100a or MCA(i+1) 100c.

In addition, BLS_down(i+1) 110f and BLS_up(i−1) 110e remain constant at Vdd. This is due to the fact that when MCA(i) 100b is active, it does not affect either of those two BLS control lines because those lines are not directly connected to any of the BLSAs 102 used by MCA(i) 100b. Furthermore, it is also shown that when a MCA(j) is active, it does not affect any of the BLS control lines, BLS_up(i) 110b, BLS_down(i) 110c, BLS_down(i+1) 110f, BLS_up(i+1) 110d, BLS_up(i−1) 110e and BLS_down(i−1)110a, provided that MCA(j) is not MCA(i) 100b or either one of MCA(i)'s 100b adjacent neighbors, MCA(i−1) 100a and MCA(i+1) 110b.

FIGS. 8a–c show the voltage levels of various BLS controls lines including, BLS_up(i) 110b, BLS down(i) 100c, BLS_down(i+1) 110f, BLS_up(i+1) 110d, BLS_up (i−1) 110e and BLS_down(i−1) 110a, during a normal mode of operation of a preferred embodiment in accordance with the present invention. A normal mode of operation is generally defined as random access in different MCAs 100. All the BLS control lines shown behave in accordance with the state transition diagrams in FIGS. 5a and 5b. FIG. 8a shows the voltage levels of BLS_up(i) 110b and BLS_ down(i) 110c which are directly connected to MCA(i) 100b. Both BLS_up(i) 110b and BLS_down(i) 110c are pulled up to Vpp from Vdd when MCA(i) 100b is activated. When the access to MCA(i) 100b is followed by an access to an adjacent MCA 100, i.e. MCA(i+1) 100c, BLS_up(i) 110b remains at Vpp while BLS_down(i) 110c drops down to ground. BLS_up(i) 110b and BLS_down(i) 110c behave differently when MCA(i+1) 100c is activated because BLS_up(i) 110b is not directly connected to the row 108d of BLSAs 102 shared by MCA(i+1) 100c. During the pre-charge of MCA(i+1) 100c, BLS_up(i) 110b remains at Vpp and BLS_down(i) 110c is pulled up to Vdd. Then, when MCA(i−1) 100a is activated, BLS_up(i) 110b drops down to ground while BLS_down(i) 110c remains constant at Vdd. In that case, BLS_down(i) 110c is not directly connected to the row 108u of BLSA 102 shared by MCA(i−1) 100a.

FIG. 8b shows the voltage levels of BLS_down(i+1) 110f and BLS_up(i+1) 110d along the same time line. When MCA(i) 100b is activated, BLS_down(i+1) 110f remains at Vdd while BLS_up(i+1) 110d is pulled down to ground. Again, this is because BLS_up(i+1) 110d is directly connected to the row 108d of BLSAs 102 shared by MCA(i) 100b. BLS_up(i+1) 110d is pulled back up to Vdd during the precharge of MCA(i) 100b. When MCA(i+1) 100c is then activated, both BLS_up(i+1) 110d and BLS_down(i+1) 110f are pulled up to Vpp. Subsequently, when the activation of MCA(i−1) 100a immediately follows, both BLS_up(i+1) 110d and BLS_down(i+1) 110f remains at Vpp, since neither of those two BLS control lines is directly connected to the row 108u of BLSAs 102 shared by MCA (i−1) 100a. Finally, when MCA(i) 100b is activated, BLS_down(i+1) 110f continues to remain at Vpp while BLS_up (i+1) 110d is pulled down to ground.

FIG. 8c shows the voltage levels of BLS_down(i−1) 110a and BLS_up(i−1) 110e along the same time line. When MCA(i) 100b is activated, BLS_up(i−1) 110e remains at Vdd while BLS_down(i−1) 110a is pulled down to ground. BLS_down(i−1) 110a is then pulled back up to Vdd during the precharge of MCA(i) 100b. When MCA(i+1) 100c is next activated, both BLS_up(i−1) 110e and BLS_down(i−1) 110a remain at Vdd, since neither of those two BLS control lines is directly connected to the row 108d of BLSAs 102 shared by MCA(i+1) 100c. When MCA(i−1) 100a is then activated, both BLS_up(i−1) 110c and BLS down(i−1) 110a are pulled up to Vpp. Finally, when MCA(i) 100b is activated, BLS_up(i−1) 110e again remains at Vdd while BLS_down(i−1) 110a is pulled down to ground.

Referring to FIGS. 9a and 9b there are shown two state diagrams illustrating the state of transition of the BLS control lines in a second preferred embodiment according to the present invention. FIGS. 9a and 9b are respectively similar to FIGS. 5a and 5b showing the state of transition of the two BLS control lines, BLS_up(i) 110b and BLS_down (i−1) 110a, controlled by BLS control 106 in accordance with the operation of MCA(i) 100b and MCA(i−1) 100a. As shown in FIGS. 9a and 9b, the difference is that BLS_up(i) 110b and BLS_down(i−1) 110a are initially set to Vpp as opposed to Vdd.

Figure 4C:
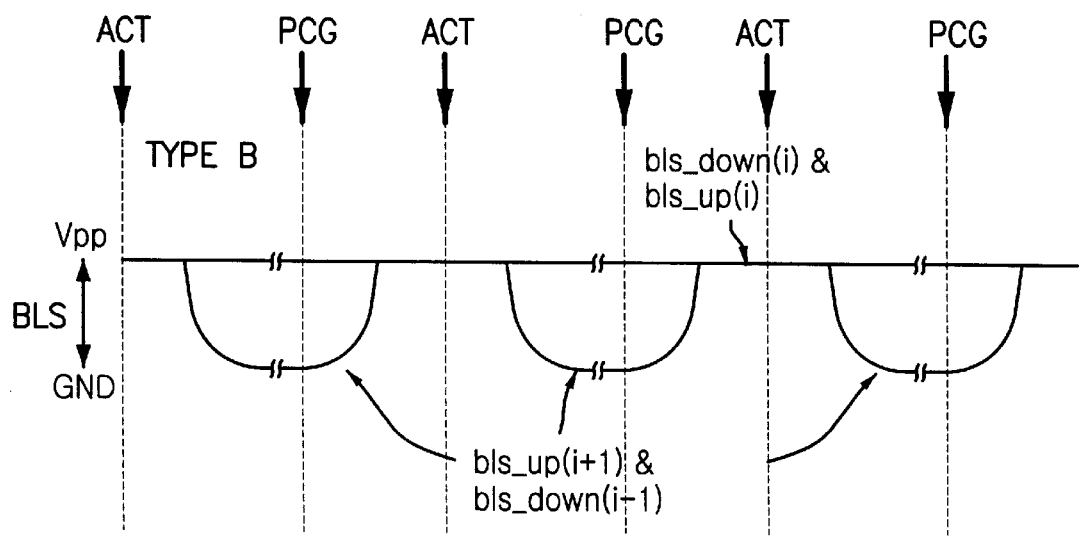
FIG. 4c is a diagram similar to FIG. 4b showing the respective voltage levels of the same BLS control lines during active cycles using different relative voltage levels.
Figure 6B:
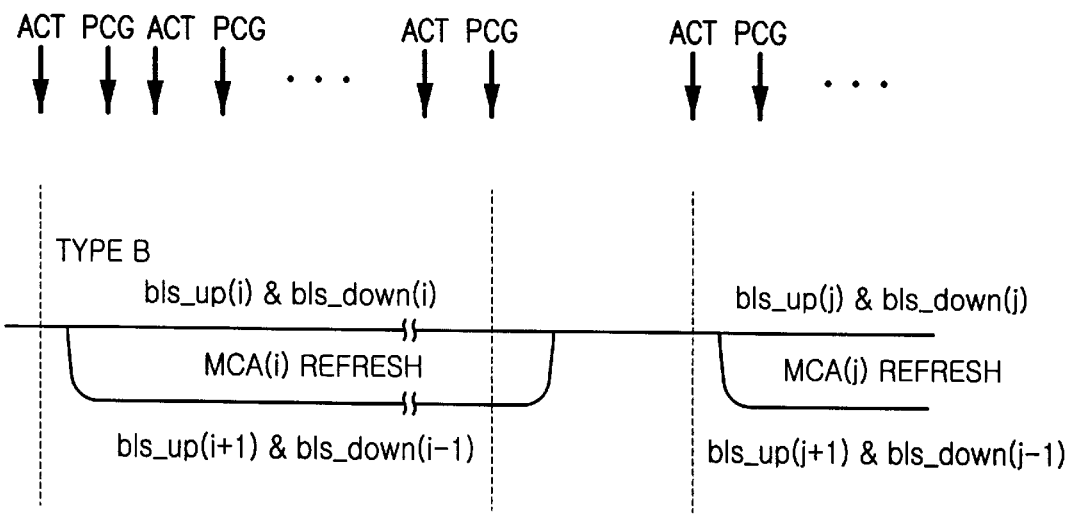

FIG. 6b shows the voltage levels of various BLS control lines including, BLS_up(i) 110b, BLS_down(i) 110c, BLS_up(i+1) 110d, and BLS_down(i−1) 110a, during a self-refresh cycle of MCA(i) 100b in accordance with a second embodiment of the present invention. As FIG. 6b shows, during the self-refresh cycle of MCA(i) 100b, BLS_up(i) 110b and BLS_down(i) 110c remain constant at Vpp and BLS_up(i+1) 110d, and BLS_down(i−1) 110a are pulled to ground and remain there until the self-refresh cycle is completed. This is to be contrasted with FIG. 4c where BLS_up(i+1) 110d, and BLS_down(i−1) 110a have to be switched between Vpp and ground during each active cycle regardless of the fact that only MCA(i) 100b is activated.

Figure 7B:
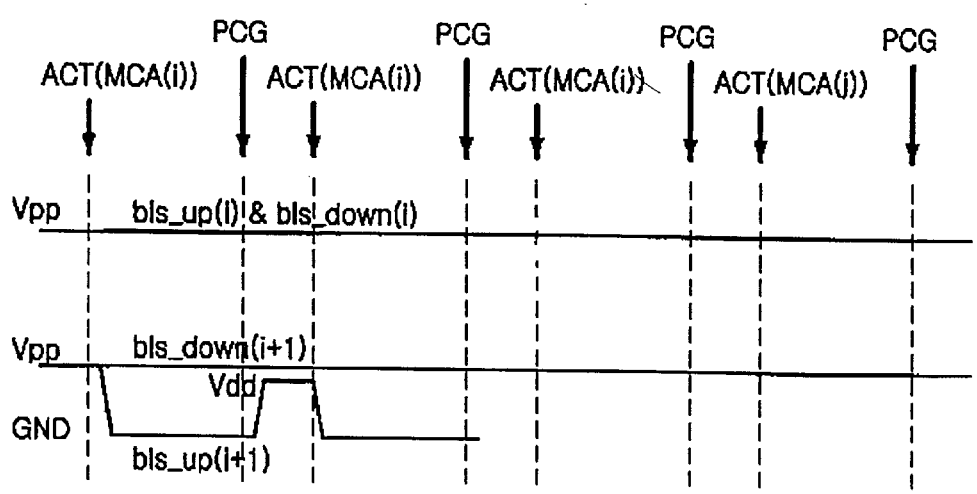
Figure 15:
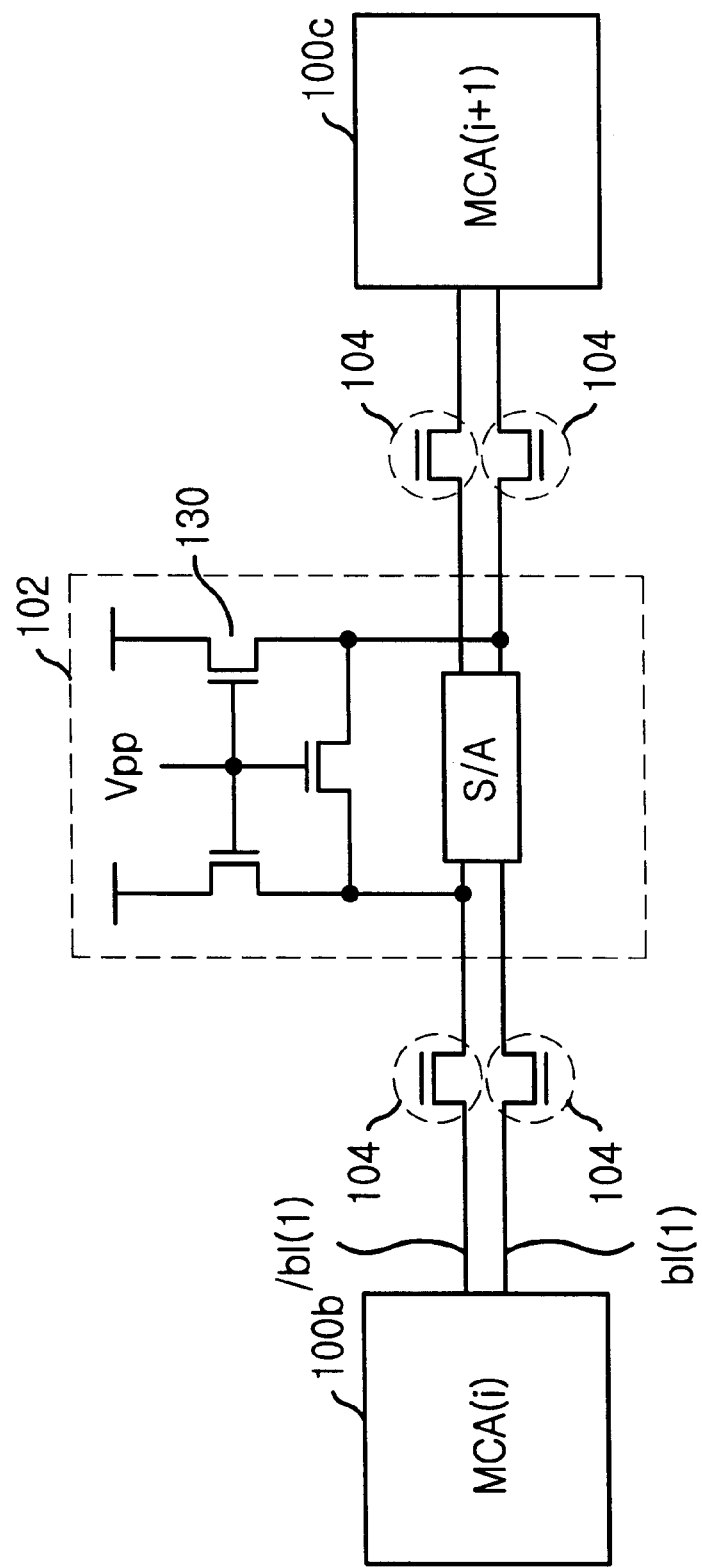
FIG. 15 shows a precharge charge circuit integrated within a bit-line sense amplifier and shared by bit lines from adjacent memory cell arrays.

FIG. 7b shows the voltage levels of various BLS controls lines including, BLS_up(i) 110b, BLS_down(i) 110c, BLS_down(i+1) 110f, BLS_up(i+1) 110d, BLS_up(i−1) 110e and BLS_down(i−1) 110a, during successive active cycles in the same MCA(i) 100b in accordance with a second embodiment of the present invention. Following the state transition diagrams as shown in FIGS. 9a and 9b, during successive active cycles in the same MCA(i) 100b, the BLS control lines, BLS_up(i) 110b and BLS_down(i) 110c, remain constant at Vpp throughout, while BLS_down (i−1) 110a and BLS_up(i+1) 110d are pulled to ground at the beginning of each active cycle and raised to Vdd during each precharge. FIG. 15 shows a precharge circuit 130 integrated within a BLSA 102. This precharge circuit 130 is shared by the bit lines, for example, b1(1) and b1($\overline{1}$), from both MCA(i) 100b and MCA(i+1) 100c. In this embodiment, as explained in connection with FIG. 7a, BLS_up(i+1) 110d is raised to Vdd during precharge to allow the shared equalization and precharge circuits within each BLSA 102 to maintain the bit lines in the unselected MCA(i+1) 100c at a specified precharge voltage to avoid floating bit lines.

Figure 16:
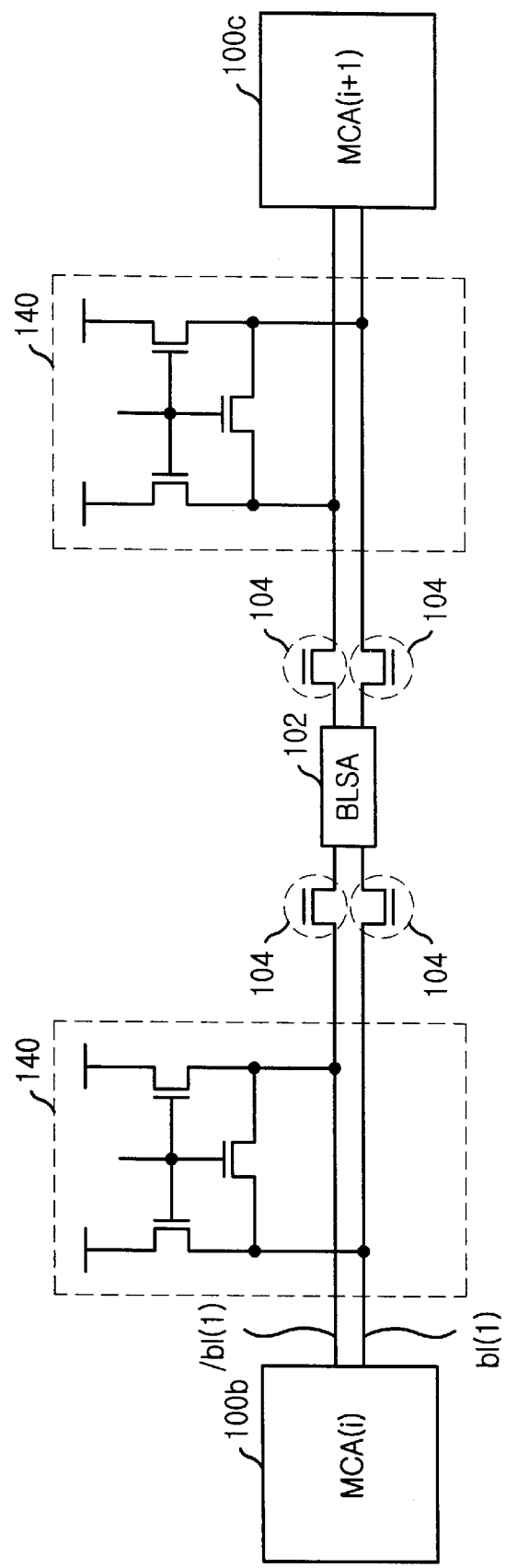
FIG. 16 shows two precharge circuits each independently serving bit lines from a memory cell array.

In an alternative embodiment (not shown), switching of the BLS control lines may be further reduced by letting BLS_up(i+1) 110d to stay at ground even during normal mode, which is when MCAs 100 are randomly accessed. However, in order to allow BLS_up(i+1) 110d to remain at ground during normal mode, a separate equalization and precharge circuit 140 is required on either side of a BLSA 102 to maintain the bit lines of MCA(i+1) 100c at a specified voltage, as shown in FIG. 16. This is possible because the transistors 104 do not affect the precharging of the bit lines. Hence, there would be no sharing of the equalization and precharge circuit 140, thus resulting in a need for more surface area for the integrated circuits.

Also shown in FIG. 7b, as expected, BLS_down(i+1) 119f and BLS_up(i−1) 110e remain constant at Vpp. This is due to the fact that when MCA(i) 100b is active, it does not affect either of those two BLS control lines because those lines are not directly connected to any of the BLSAs 102 used by MCA(i) 100b. Furthermore, it is also shown that when a MCA(j) is active, it does not affect any of the BLS control lines, BLS_up(i) 110b, BLS_down(i) 110c, BLS_down(i+1) 110f, BLS_up(i+1) 110d, BLS_up(i−1) 119e and BLS_down(i−1) 110a, provided that MCA(j) is not MCA(i) 100b or either one of MCA(i)'s 100b adjacent neighbors, MCA(i−1) 100a and MCA(i+1) 100e.

Hence, as shown by FIGS. 6–8, by using the present invention, excessive and unnecessary switching of BLS control lines can be avoided thereby reducing significant amount of power consumption.

Figure 10:
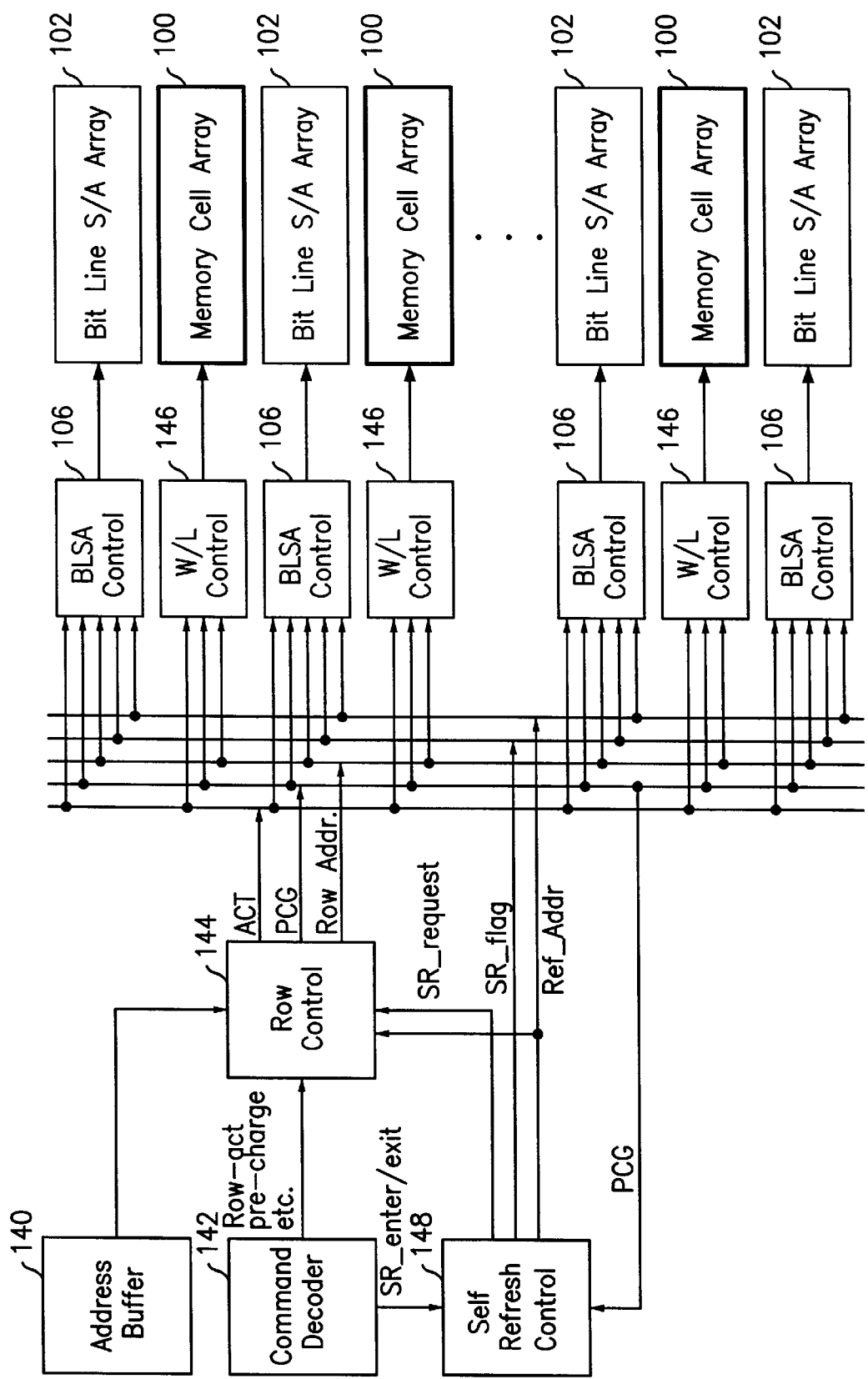
FIG. 10 is a simplified block diagram showing a memory circuit in accordance with the present invention.

FIG. 10 is a simplified block diagram showing a memory circuit in accordance with the present invention. FIGS. 11–14 show various embodiments of the BLS control 106 in accordance with the present invention. The BLS control 106 controls the transitional states of the BLS control lines thereby implementing the proper switching of the BLS control lines in accordance with the present invention.

The memory circuit shown in FIG. 10 operates as follows. The memory address provided by logic circuitry is stored in the address buffer 140. The memory operation command provided by logic circuitry is decoded by the command decoder 142. The respective outputs from the address buffer 140 and command decoder 142 are used by the row control 144 to generate certain signals to control the BLS controls 106 and the W/L controls 146. The W/L controls 146 control which one of the memory cell arrays 100 should be activated and the BLS controls 106 correspondingly activate the appropriate the bit-line sense amplifier arrays associated with the activated memory cell arrays 100 to implement the desired memory operation. In addition, if the memory operation command indicates a self-refresh operation, the self-refresh control 148 is also used to control the row control 144, the BLS controls 106 and the W/L controls 146 to achieve the desired self-refresh operation.

Figure 11:
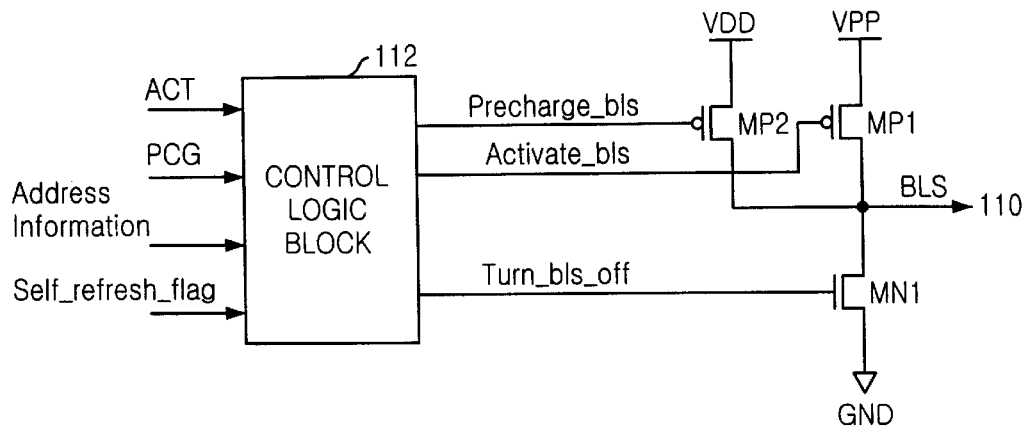
FIG. 11 is a schematic block diagram showing a preferred embodiment of the BLS control in accordance with control in accordance with the present invention.

A first preferred embodiment of the BLS control 106 is shown in FIG. 11. It should be noted that FIG. 11 only shows the circuit for controlling one BLS control line. Since a BLS control 106 has two BLS control lines, it should be understood that a complete BLS control 106 should contain at least two such circuits. The BLS control 106 includes a control logic block 112, a transistor MP1, a transistor MP2 and a transistor MN1. The control logic block 112 receives the following signals from the memory circuit control logic: ACT signaling activation of that array, PCG indicating precharge operation, Address Information and Self_refresh_flag. These control logic block 112 signals are uniformly available to all the BLS controls 106, as shown in FIG. 10, and are commonly generated in most dynamic RAMs. Using these input signals, the control logic block 112 outputs the following signals: Precharge_bls, Activate_bls and Turn_bls_off. Transistor MP1 is preferably a p-channel transistor. The gate of transistor MP1 is connected to the signal, Activate_bls, the source is connected to a power supply Vpp, and the drain is connected to the BLS control line 110. Transistor MP2 is also preferably a p-channel transistor. The gate of transistor MP2 is connected to the output signal, Precharge_bls, the source is connected to a power supply Vdd, and the drain is connected to the BLS control line 110. Transistor MN1 is preferably a n-channel transistor. The gate of transistor MN1 is connected to the signal, Turn_bls_off, the source is connected to the BLS control line 110, and the drain is connected to ground. The output signals, Precharge_bls, Activate_bls and Turn_bls_off, are used to control the transistors MP1, MP2 and MN1 which, in turn, determine the state of the BLS control line 118. For example, focusing on BLS_up(i) 110b, if MCA(i) 100b is to be activated, then the output signal, Activate_bls, turns on transistor MP1 thereby pulling BLS_up(i) 110b to Vpp; if MCA(i−1) 100a is to be activated instead, then the signal, Turn_bls_off, turns on transistor MN1 thereby pulling BLS_up(i) 110b to ground; and if MCA(i−1) 100a is to be precharged, then the signal, Precharge_bls, switches on transistor MP2 thereby pulling BLS_up(i) 110b to Vdd.

Figure 12:
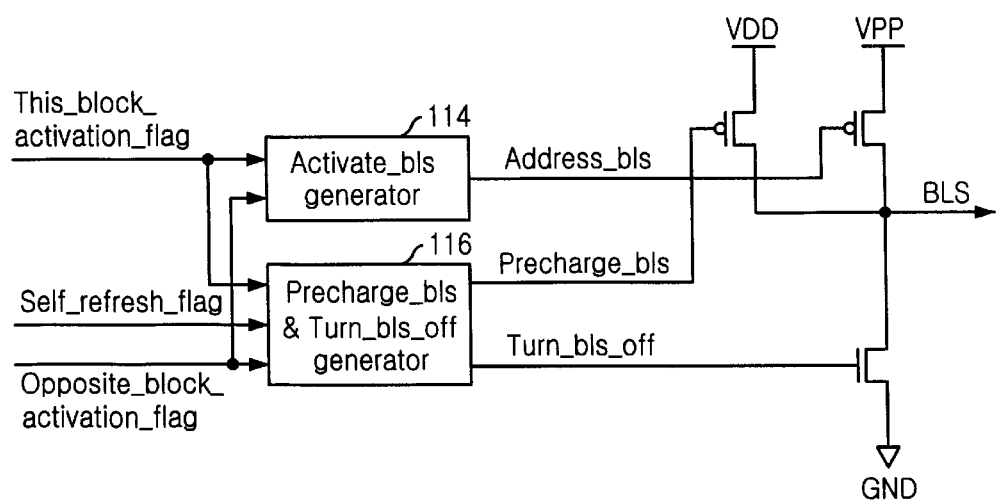
FIG. 12 is a schematic block diagram further showing the components of an element of a preferred embodiment of the BLS control in accordance with the present invention.

FIG. 12 is a schematic block diagram further showing the components of the control logic block 112. The control logic block 112 includes an activate_bls generator 114 and a precharge_bls & turn_bls_off generator 116. The activate_bls generator 114 accepts as input the two signals, This_block_activation_flag and Opposite_block_activation_flag, to produce the Activate_bls signal. The precharge_bls & turn_bls_off generator 116 accepts as input the Self_refresh_flag. This_block_activation_flag and Opposite_block_activation_flag are used to produce the Precharge_bls and the Turn_bls_off signals. This_block_activation_flag and Opposite_block_activation_flag are pre-decoded based on the ACT, PCG, Address Information and Self_refresh_flag signals.

Figure 14:
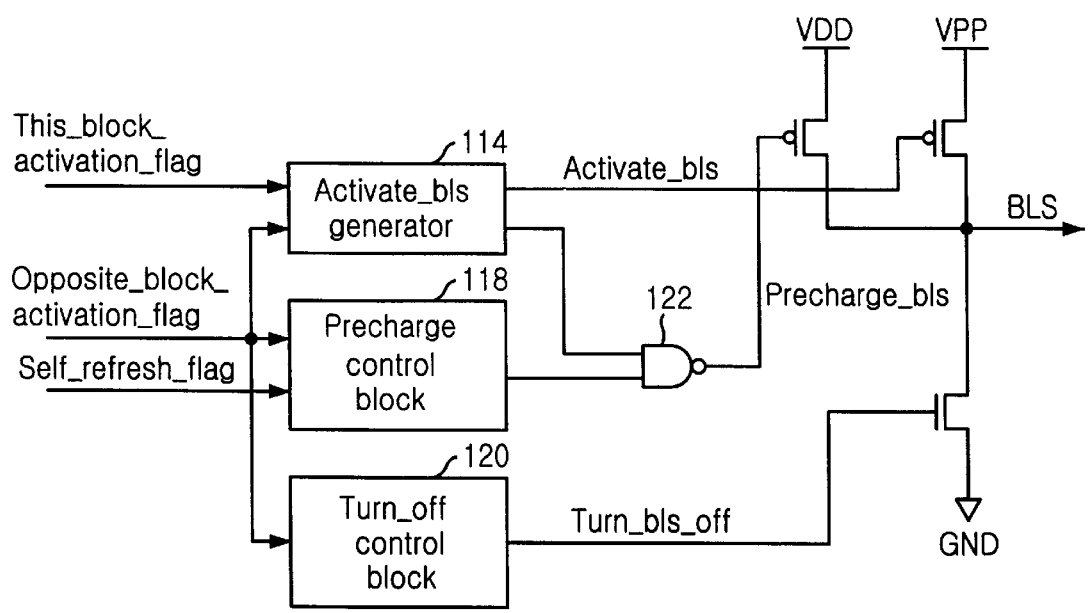
FIG. 14 is a schematic block diagram further showing the components of an element of a preferred embodiment of the BLS control in accordance with the present invention.

FIG. 14 is a block diagram schematic further showing the components of the Precharge_bls & turn_bls_off generator 116 shown in FIG. 12. The Precharge_bls & turn_bls_off generator 116 includes a Precharge Control Block 118, a Turn_off Control Block 120, and a NAND gate 122. The Precharge Control Block 118 receives the Opposite_activation_flag and the Self_refresh_flag as input and directs its output to the input of the NAND gate 122. The NAND gate 122 accepts the output from the Precharge Control Block 118 and the Activate_bls generator 114 to produce the Precharge_bls signal at its output. The Turn_off Control Block 120 receives the Opposite_block_activation_flag and generates the Turn_bls_off signal.

Figure 13:
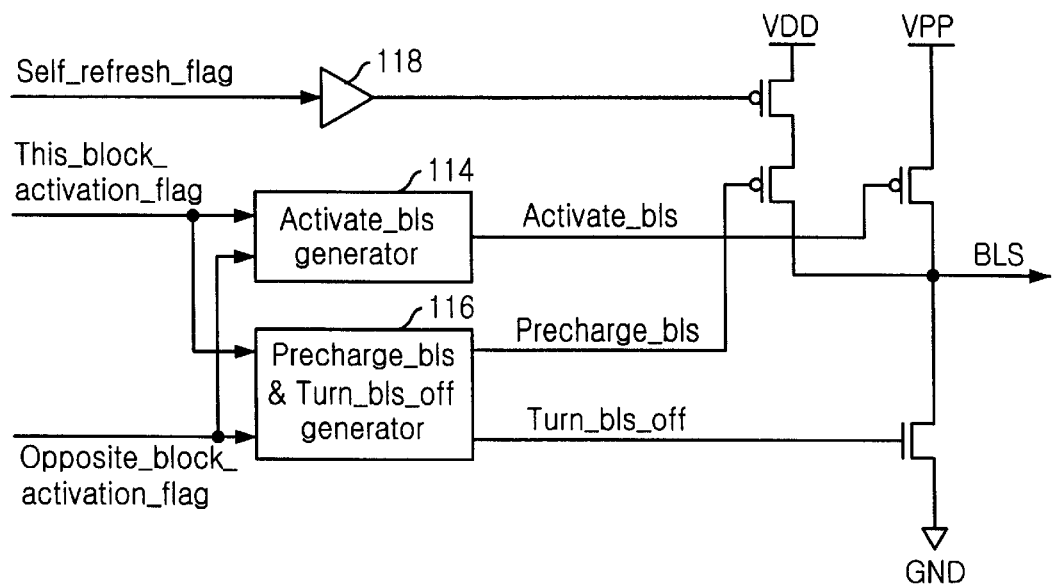
FIG. 13 is a schematic block diagram showing an alternative embodiment of the BLS control in accordance with the present invention.

FIG. 13 is a schematic block diagram showing an alternative embodiment of the BLS control 106 as shown in FIG. 11. The Self_refresh_flag is fed separately into a buffer 118. The output of the buffer 118 is connected to the gate of a transistor MP3. Transistor MP3 is connected in series between the power supply Vdd and transistor MP2.

It is understood that the examples and embodiments described herein are for illustrative purposes only and that various modifications or changes in light thereof will be suggested to persons skilled in the art and are to be included within the spirit and purview of this application and scope of the appended claims. All publications, patents, and patent applications cited herein are hereby incorporated by reference for all purposes in their entirety.

What is claimed is:

1. A method of operating a memory circuit, comprising the steps of:

disposing a plurality of bit-line sense amplifiers between a pair of adjacent arrays of memory cells;

activating a first one of said pair of adjacent arrays of memory cells;

coupling said plurality of bit-line sense amplifiers to said first one of said pair of adjacent arrays of memory cells by turning on a plurality of coupling switches;

keeping said plurality of coupling switches on even after said first one of said pair of adjacent arrays of memory cells is deactivated; and switching off said plurality of coupling switches when a second one of said pair of adjacent arrays of memory cells is activated.

2. A method of operating a memory device, comprising the steps of:

coupling a plurality of sense amplifiers to a plurality of bit lines in a first array of memory cells via a first plurality of bit-line select switches;

coupling said plurality of sense amplifiers to a plurality of bit lines in a second array of memory cells via a second plurality of bit-line select switches;

switching on said first plurality of bit-line select switches when said first array of memory cells is activated;

keeping said first plurality of bit-line select switches switched on even after said first array of memory cells is deactivated; and switching off said first plurality of bit-line select switches when said second array of memory cells is activated.

3. The method of claim 2 further comprising:

using a first bit-line select control line to control operation of said first plurality of bit-line select switches; and using a second bit-line select control line to control operation of said second plurality of bit-line select switches.

4. The method of claim 3 further comprising:

maintaining said first bit-line select control line at a first designated potential during a self-refresh cycle of said first array of memory cells.

5. The method of claim 4 further comprising:

maintaining said second bit-line select control line at a second designated potential during the self-refresh cycle of said first array of memory cells.

6. The method of claim 5 wherein said first designated potential is the potential of a power supply for said memory device and said second designated potential is a ground.

7. The method of claim 3 wherein said first bit-line select control line is capable of being in one of several different states, said several different states including a Vdd state, a Vpp state and a ground state;

wherein said Vdd state is reached by said first bit-line select control line when said first bit-line select control line is first powered on or when said second array of memory cells is precharged or upon completion of a self-refresh cycle of said second array of memory cells;

wherein said Vpp state is reached by said first bit-line select control line when said first array of memory cells is precharged or activated or when said first array of memory cells is engaged in a self-refresh cycle; and wherein said ground state is reached by said first bit-line select control line when said second array of memory cells is activated or when said second array of memory cells is engaged in a self-refresh cycle.

8. The method of claim 3, wherein said second bit-line select control line is capable of being in one of said several different states;

wherein said Vdd state is reached by said second bit-line select control line when said second bit-line select control line is first powered on or when said first array of memory cells is precharged or upon completion of a self-refresh cycle of said first array of memory cells;

wherein said Vpp state is reached by said second bit-line select control line when said second array of memory cells is precharged or activated or when said second array of memory cells is engaged in a self-refresh cycle; and wherein said ground state is reached by said second bit-line select control line when said first array of memory cells is activated or when said first array of memory cells is engaged in a self-refresh cycle.

9. The method of claim 7, wherein said Vpp state, instead of said Vdd state, is reached by said first bit-line select control line when said first bit-line select control line is first powered on.

10. The method of claim 8, wherein said Vpp state, instead of said Vdd state, is reached by said second bit-line select control line when said second bit-line select control line is first powered on.

11. A method of operating a memory device, comprising the steps of:

coupling a plurality of sense amplifiers to a plurality of bit lines in a first array of memory cells via a first plurality of bit-line select switches, said first plurality of bit-line select switches being controlled by a first bit-line select control line;

coupling said plurality of sense amplifiers to a plurality of bit lines in a second array of memory cells via a second plurality of bit-line select switches, said second plurality of bit-line select switches being controlled by a second bit-line select control line;

initializing said first and second bit-line select control lines to a first reference potential;

switching on said first plurality of bit-line select switches by raising the first bit-line select control line to a second reference potential when said first array of memory cells is activated;

keeping said first plurality of bit-line select switches switched on by maintaining the first bit-line select control line at said second reference potential even after said first array of memory cells is deactivated; and switching off said first plurality of bit-line select switches by lowering the first bit-line select control line to ground when said second array of memory cells is activated.

12. The method of claim 11 wherein said first bit-line select control line is maintained at said second reference potential and said second bit-line select control line is maintained at ground, during a self-refresh cycle of said first array of memory cells.

* * * * *